(12) United States Patent
Atsuji et al.

(10) Patent No.: US 11,332,410 B2
(45) Date of Patent: May 17, 2022

(54) SINTERED COMPACT, CIRCUIT COMPONENT, AND METHOD OF PRODUCING SINTERED COMPACT

(71) Applicant: NGK INSULATORS, LTD., Nagoya (JP)

(72) Inventors: Kyohei Atsuji, Nagoya (JP); Noboru Nishimura, Nagoya (JP); Yuji Katsuda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 16 days.

(21) Appl. No.: 16/776,874

(22) Filed: Jan. 30, 2020

(65) Prior Publication Data

US 2020/0165168 A1    May 28, 2020

Related U.S. Application Data

(63) Continuation of application No. PCT/JP2017/029654, filed on Aug. 18, 2017.

(51) Int. Cl.
| | | |
|---|---|---|
| C04B 35/626 | (2006.01) | |
| C04B 35/109 | (2006.01) | |
| C04B 35/65 | (2006.01) | |
| C04B 35/111 | (2006.01) | |
| H01B 3/12 | (2006.01) | |
| H01L 23/15 | (2006.01) | |
| H05K 3/46 | (2006.01) | |

(52) U.S. Cl.
CPC ............ *C04B 35/65* (2013.01); *C04B 35/111* (2013.01); *H01B 3/12* (2013.01); *H01L 23/15* (2013.01); *H05K 3/46* (2013.01)

(58) Field of Classification Search
CPC ......... C04B 35/65; C04B 35/111; H01B 3/12; H01L 23/15; H05K 3/46
See application file for complete search history.

(56) References Cited

U.S. PATENT DOCUMENTS

| | | | |
|---|---|---|---|
| 5,639,704 A | 6/1997 | Inuzuka et al. | |
| 2001/0046935 A1 | 11/2001 | Okamura | |
| 2003/0209537 A1* | 11/2003 | Dalton | H05B 6/6494 |
| | | | 219/634 |
| 2018/0104848 A1* | 4/2018 | Badding | C04B 35/64 |

FOREIGN PATENT DOCUMENTS

| | | |
|---|---|---|
| JP | H08-169774 A1 | 7/1996 |
| JP | 2001-097767 A1 | 4/2001 |

(Continued)

OTHER PUBLICATIONS

JP2003104772 translation (Year: 2003).*

(Continued)

*Primary Examiner* — Karl E Group
*Assistant Examiner* — Cameron K Miller
(74) *Attorney, Agent, or Firm* — Burr & Brown, PLLC

(57) ABSTRACT

A sintered compact includes an alumina phase as a primary phase, and further includes an amorphous phase containing Si and Mn and a cordierite phase. The sintered compact has a porosity of higher than or equal to 1.1% and less than or equal to 5.0%. Preferably, I1/(I1+I2) is greater than or equal to 0.20 and less than or equal to 0.45, where I1 is the strength of the main peak of cordierite obtained by an XRD method, and I2 is the strength of the main peak of alumina.

13 Claims, 2 Drawing Sheets

(56) References Cited

FOREIGN PATENT DOCUMENTS

| | | | |
|---|---|---|---|
| JP | 2001-270774 | A1 | 10/2001 |
| JP | 2003-095731 | A1 | 4/2003 |
| JP | 2003-104772 | A1 | 4/2003 |
| JP | 2003104772 | * | 4/2003 |
| JP | 2004-115290 | A1 | 4/2004 |
| JP | 2004-256345 | A1 | 9/2004 |
| JP | 2004-323275 | A1 | 11/2004 |

OTHER PUBLICATIONS

Japanese Office Action (Application No. 2019-536404) dated May 13, 2021 (with English translation).
International Search Report and Written Opinion (Application No. PCT/JP2017/029654) dated Oct. 10, 2017.
English translation of the International Preliminary Report on Patentability (Chapter I) (Application No. PCT/JP2017/029654) dated Feb. 27, 2020.

* cited by examiner

SINTERED COMPACT, CIRCUIT COMPONENT, AND METHOD OF PRODUCING SINTERED COMPACT

The present application is a continuation application of International Application No. PCT/JP2017/029654, filed on Aug. 18, 2017. The content of this application is incorporated herein by reference in its entirety.

TECHNICAL FIELD

The present invention relates to a sintered compact including an alumina phase as a primary phase.

BACKGROUND ART

As the frequencies of circuit components become higher, components that hold circuitry or other components are required to have lower relative dielectric constants and lower dielectric dissipation factors. In the field of optical communications, for example, frequencies that are used by components of optical communications packages or other items are becoming higher with increasing speeds in communications. In order to transmit signals at high speeds without deteriorating signal quality, various materials used in the components are required to have lower relative dielectric constants and lower dielectric dissipation factors. The materials are also required to have higher strength as the components have smaller sizes and lower profiles.

The alumina sintered compact disclosed in Japanese Patent Application Laid-Open No. 2003-104772 (Document 1) is produced by firing a compact at a temperature of 1200 to 1500° C., the compact containing alumina powder, $Mn_2O_3$ and $SiO_2$ powder both serving as sintering agents, and other oxides. The alumina sintered compact has a relative density of higher than or equal to 95%, a dielectric dissipation factor of $12 \times 10^{-4}$ to $28 \times 10^{-4}$, and a strength of 400 to 505 MPa. The alumina sintered compact according to Document 1 has a certain degree of strength, but has a high dielectric dissipation factor for the material for high-frequency circuits used in applications such as high-speed communications. Besides, components other than alumina have relative dielectric constants that are not low, and the porosity estimated from the relative density is low. Thus, the relative dielectric constant is estimated to be higher than or equal to 8.9, which also is high for the material for high-frequency circuits.

The alumina sintered compact disclosed in Japanese Patent Application Laid-Open No. 2001-97767 (Document 2) is produced by firing a compact at a temperature of 1200 to 1500° C., the compact containing alumina powder, $Mn_2O_3$ and $SiO_2$ powder both serving as sintering agents, and other oxides. In the alumina sintered compact, $MnAl_2O_4$ and $MnSi_2O_4$ are deposited in the grain boundary phase of alumina crystal grains. The alumina sintered compact has a relative density of higher than or equal to 95%, a lowest dielectric dissipation factor of $20 \times 10^{-4}$, and a strength of 350 to 492 MPa. The alumina sintered compact according to Document 2 also has a certain degree of strength, but may not have a sufficiently low dielectric dissipation factor for the material for high-frequency circuits used in applications such as high-speed communications. Besides, as in the case of Document 1, components other than alumina have relative dielectric constants that are not low, and the porosity estimated from the relative density is low. Thus, the relative dielectric constant is estimated to be higher than or equal to 8.9, which also is high for the material for high-frequency circuits.

Japanese Patent Application Laid-Open No. 2004-115290 (Document 3) discloses complex oxide sintered compacts in which alumina particles are dispersed with a content of 10 to 70 mass % in a matrix of crystallized glass. The complex oxide sintered compacts are fired at low temperatures of 900 to 1000° C. They have relative dielectric constants of 7.5 to 9.0, dielectric dissipation factors of $6 \times 10^{-4}$ to $15 \times 10^{-4}$ at 60 GHz, and strengths of 350 to 500 MPa. Some of the complex oxide sintered compacts according to Document 3 have low relative dielectric constants, but their dielectric dissipation factors are high for the material for high-frequency circuits. Since the firing temperature is low, Cu is used as a metallized wiring layer (conductor) that is fired simultaneously with an insulated substrate. However, because of a large difference in the coefficient of thermal expansion between Cu and the complex oxide in which alumina particles are dispersed in the matrix of glass, stresses are likely to occur in components in which Cu wiring is buried. Accordingly, problems such as cracks, exfoliation, or warpage may occur when components have smaller sizes and lower profiles.

SUMMARY OF INVENTION

The present invention is intended for a sintered compact including an alumina phase as a primary phase, and it is an object of the present invention to provide a sintered compact having a low relative dielectric constant, a low dielectric dissipation factor, and a desired bending strength.

A sintered compact according to a preferred embodiment of the present invention includes an alumina phase as a primary phase, and further includes an amorphous phase containing Si and Mn and a cordierite phase. The sintered compact has a porosity of higher than or equal to 1.1% and less than or equal to 5.0%. Accordingly, the sintered compact can have a lower relative dielectric constant and a lower dielectric dissipation factor and can obtain a certain degree of bending strength.

Preferably, $I1/(I1+I2)$ is greater than or equal to 0.20 and less than or equal to 0.45, where I1 is a strength of a main peak of cordierite obtained by an XRD method, and I2 is a strength of a main peak of alumina. More preferably, $I1/(I1+I2)$ is greater than or equal to 0.23 and less than or equal to 0.40.

The relative dielectric constant of the sintered compact is preferably less than or equal to 8.5 at 10 GHz, and the dielectric dissipation factor is preferably less than or equal to $5 \times 10^{-4}$ at 10 GHz. The bending strength is preferably higher than or equal to 300 MPa. The water absorption is preferably less than or equal to 1.0%. The mean pore diameter is preferably greater than or equal to 2.0 μm and less than or equal to 5.5 μm.

The present invention is also intended for a circuit component including the above-described sintered compact. The circuit component includes a conductor disposed on a surface of the sintered compact or inside the sintered compact.

The present invention is also intended for a method of producing a sintered compact. In the production of the sintered compact, powder is prepared, which contains alumina with a content higher than or equal to 70 mass % and lower than or equal to 85 mass %, an Si component with a content higher than or equal to 3 mass % and lower than or equal to 7 mass % in terms of $SiO_2$, an Mn component with a content higher than or equal to 3 mass % and lower than or equal to 6.5 mass % in terms of MnO, and cordierite with a content higher than or equal to 8 mass % and lower than or equal to 15 mass %. A total of the contents of these four components is higher than or equal to 85 mass %. A compact is obtained from the powder, and the compact is fired.

The firing temperature is preferably kept in a range of 1200° C. to 1400° C. for a duration of more than or equal to one hour and less than or equal to three hours.

In the powder which is a raw material, a sum of the mass of the Si component in terms of $SiO_2$ and the mass of the Mn component in terms of MnO is preferably less than or equal to 11 mass % of the powder. Also, the ratio between the mass of the Si component in terms of $SiO_2$ and the mass of the Mn component in terms of MnO is preferably higher than or equal to 0.6 and less than or equal to 2.0.

These and other objects, features, aspects and advantages of the present invention will become more apparent from the following detailed description of the present invention when taken in conjunction with the accompanying drawings.

DESCRIPTION OF EMBODIMENTS

A sintered compact and a method of producing a sintered compact according to an embodiment of the present invention will be described hereinafter with reference to the drawings. The sintered compact and the method of producing a sintered compact according to the present invention are not intended to be limited to the embodiment described below, and various changes, modifications, improvements can be made without departing from the gist of the present invention.

The sintered compact according to the present invention includes an alumina phase as a primary phase. The term "primary phase" as used herein refers to a phase that occupies 50% or more of the area, excluding pores, in section. The sintered compact includes an amorphous phase containing Si and Mn and a cordierite phase as secondary phases. The term "secondary phases" refers to phases other than the primary phase. The sintered compact may further include other phases. The amorphous phase containing Si and Mn serves mainly as a flux phase that improves bonding properties of alumina particles. Meanwhile, the presence of the cordierite phase lowers the relative dielectric constant of the sintered compact as a whole because cordierite has a lower relative dielectric constant than alumina. Note that cordierite particles introduced as a raw material react in part with alumina particles and flux component particles in the course of sintering and produces an effect of accelerating sintering. That is, the sintering conducted while causing reactions of alumina, flux, and cordierite allows the sintered compact according to the present invention to develop a certain degree of denseness and strength while leaving pores that are necessary for a reduction in relative dielectric constant and to obtain a low relative dielectric constant and a low dielectric dissipation factor.

The sintered compact that is used as a substrate or support of a high-frequency circuit preferably has a relative dielectric constant of less than or equal to 8.5, a dielectric dissipation factor of less than or equal to $5 \times 10^{-4}$, and a bending strength of higher than or equal to 300 MPa. Such a sintered compact is, in particular, suitable for circuit components used in high-speed communications such as optical communications.

For example, a pattern including a powdery conductive material is formed by printing or other methods on a sheet-like compact before firing, and such compacts are laminated one above another. In this way, a laminated compact including the conductive material is obtained. Through firing of the laminated compact, the patterns inside or on the surface of the laminated compact are also fired, and a sintered compact that includes therein or thereon a conductor such as wiring is obtained. The sintered compact including the conductor is hereinafter referred to as a "complex sintered compact."

Figure 1:
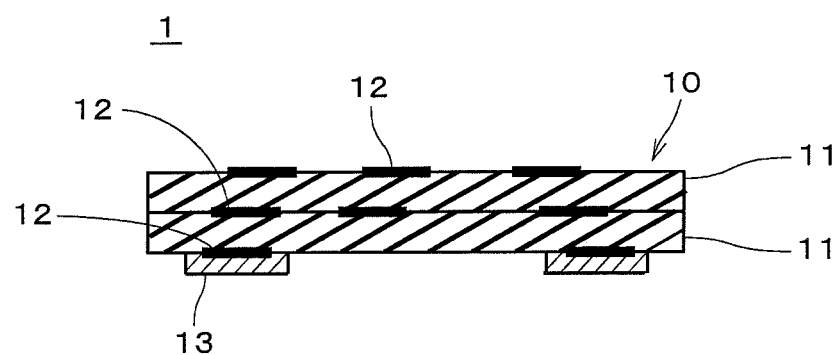
FIG. 1 is a sectional view illustrating an example of a circuit component.

FIG. 1 is a sectional view illustrating an example of a circuit component that includes a complex sintered compact. A circuit component 1 includes a plurality of substrate layers 11 serving as a sintered compact 10, a conductor 12 serving as wiring, and an electrode 13. The sintered compact 10 and the conductor 12 constitute a principal part of the complex sintered compact. The circuit component 1 may further include a sealing resin that covers the sintered compact 10. Each substrate layer 11 before firing is a sheet-like compact. The conductor 12 before firing is a conductive material formed on the compacts. Through co-firing of the compacts and the conductor material, the compacts and the conductive material are integrated into the complex sintered compact that includes the conductor 12 disposed on the surface of the sintered compact 10 or inside the sintered compact 10. In FIG. 1, vias serving as conductors that pass through the substrate layers 11 and other circuit parts are not shown.

In the circuit component 1, the conductor 12 and the electrode 13 are electrically connected to each other. The conductor 12 may be provided only inside the sintered compact 10, or may be provided only on the surface of the sintered compact 10. The number of substrate layers 11 may be one. The conductor 12 may serve a part used in applications other than wiring.

Figure 2:
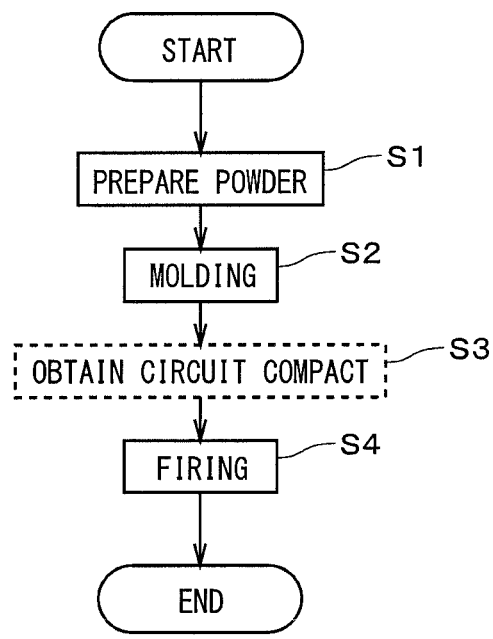
FIG. 2 schematically illustrates a procedure for production of a sintered compact.

FIG. 2 schematically illustrates a procedure for production of the sintered compact. First, raw powder for the sintered compact is prepared (step S1). For example, a mixture of alumina powder, $SiO_2$ powder, $MnCO_3$ powder, and cordierite powder is used as a raw material for the sintered compact. The $SiO_2$ powder and the $MnCO_3$ powder function as flux. Other alternative raw materials may be used. For example, MnO powder may be used, instead of the $MnCO_3$ powder.

Next, a compact of the raw powder is obtained (step S2). In examples described below, compacts are obtained by dry pressing and CIP (cold isostatical pressing), but other various methods may be used. For example, well-known molding methods such as doctor blading, extrusion, ejection, and casting are available. Assistants used in molding, such as a binder, may be removed by heating or other methods as necessary.

In the case of producing the above-described circuit component, a laminated compact is made of compacts before firing (step S3). In this case, patterns are formed of conductive powder or other materials on compacts as described previously. The laminated compact is formed by laminating a plurality of compacts. This lamination is not conducted when there is only a single layer of compact that includes circuitry. In the case of obtaining a sintered compact that does not include circuitry, step S3 is omitted.

After the compact or the laminated compact is prepared, firing is conducted (step S4). In the case of firing a compact that includes a conductive material, the compact and the conductive material are fired at the same time. A preferable range of the firing temperature is higher than or equal to 1200° C. and lower than or equal to 1400° C., and preferably higher than or equal to 1300° C. and lower than or equal to 1400° C. With this firing temperature, the compact and the pattern of conductive powder such as Cu—W, Mo—Mn, or Cu—Mo can be fired at the same time. The co-firing with the conductor is preferably conducted in hydrogen atmosphere. Other conceivable atmospheric conditions include argon atmosphere, nitrogen atmosphere, and vacuum atmosphere.

In the examples described later, the firing time was set to two hours. However, the firing time depends on the firing temperature, and a duration of time that the firing temperature is kept in a desired range is preferably more than or equal to one hour and less than or equal to three hours. This is because long-duration firing (in particular at high temperatures) causes material components to react too excessively and results in an excessive loss of pores and an excessive reduction of the cordierite phase, thereby inhibiting a reduction of the relative dielectric constant.

The sintered compact includes the cordierite phase that has a relatively lower coefficient of thermal expansion than the alumina phase. This reduces a difference in the coefficient of thermal expansion between the sintered compact and the conductor such as Cu—W, Mo—Mn, or Cu—Mo. As a result, problems such as cracks or warpage in the complex sintered compact are suppressed, and the stability and reliability of the characteristics of, in particular, small-sized circuit components are improved. Such a sintered compact material is suitable for circuit components such as communication components whose frequencies are becoming higher and whose profiles are becoming lower.

In the case of combining cordierite into the sintered compact, if the cordierite phase is generated by reactions occurring in the course of firing, not by using cordierite itself as a raw material, other materials such as forsterite, enstatite, or sapphirine may be used. However, the amount of cordierite in the sintered compact is important, and it is preferable that the raw material contains cordierite powder in order to accurately control the amount of cordierite to be contained after firing.

As additional components other than cordierite, for example, Mg-spinel or mullite are also considered. However, Mg-spinel has a relative dielectric constant of 8.8 and mullite has a relative dielectric constant of approximately 6.5, and these relative dielectric constants are higher than 4.8, which is the relative dielectric constant of cordierite. Therefore, Mg-spinel or mullite needs to be added in large amounts in order to reduce the relative dielectric constant of the sintered compact, which induces a reduction in the bending strength of the sintered compact and an increase in the dielectric dissipation factor of the sintered compact. Besides, in the case of co-firing with the conductor, the firing is conducted in high reducing atmosphere in which hydrogen is introduced. Even in such an atmosphere, cordierite does not reduce oxides and is suitable as an additive.

The cordierite in the raw material reacts with part of the alumina and the flux during firing. On the other hand, the amount of cordierite remaining in the sintered compact significantly affects various characteristics of the sintered compact. Therefore, it is important to leave a certain amount of cordierite in the sintered compact while causing cordierite to react with other materials. The amount of the cordierite in the raw material, the amount of the flux, the ratio of each component of the flux, and the firing temperature can be essential conditions for the production of the sintered compact. Preferable ranges of these conditions will be described with reference to the examples described below. Tables 1A and 1B show the conditions and measurement results for the examples.

TABLE 1A

| | Alumina | | Flux | | | | Cordierite | | Firing | |
| | Particle Diameter ($\mu$m) | mass % | $SiO_2$ (mass %) | MnO (mass %) | $SiO_2$/MnO (mass ratio) | $SiO_2$ + MnO (mass %) | Particle Diameter ($\mu$m) | mass % | Firing Temperature (° C.) | Firing Atmosphere |
|---|---|---|---|---|---|---|---|---|---|---|
| Example 1* | 2.9 | 90.0 | 5.8 | 4.2 | 1.4 | 10 | — | 0.0 | 1330 | Air atmosphere |
| Example 2* | 2.9 | 90.0 | 5.8 | 4.2 | 1.4 | 10 | — | 0.0 | 1360 | |
| Example 3* | 2.9 | 85.0 | 5.8 | 4.2 | 1.4 | 10 | 3.0 | 5.0 | 1330 | |
| Example 4 | 2.9 | 81.3 | 5.8 | 4.2 | 1.4 | 10 | 3.0 | 8.7 | 1330 | |
| Example 5 | 2.9 | 80.0 | 5.8 | 4.2 | 1.4 | 10 | 3.0 | 10 | 1330 | |
| Example 6 | 2.9 | 75.0 | 5.8 | 4.2 | 1.4 | 10 | 3.0 | 15 | 1330 | |
| Example 7 | 1.7 | 83.5 | 3.2 | 3.3 | 1.0 | 6.5 | 1.7 | 10 | 1300 | |
| Example 8 | 1.7 | 81.5 | 4.2 | 4.3 | 1.0 | 8.5 | 1.7 | 10 | 1300 | |
| Example 9 | 1.7 | 80.0 | 5.0 | 5.0 | 1.0 | 10 | 1.7 | 10 | 1300 | |
| Example 10 | 1.7 | 81.5 | 4.2 | 4.3 | 1.0 | 8.5 | 1.7 | 10 | 1330 | |
| Example 11* | 1.7 | 80.0 | 3.3 | 6.7 | 0.5 | 10 | 1.7 | 10 | 1300 | |
| Example 12 | 1.7 | 80.0 | 3.7 | 6.3 | 0.6 | 10 | 1.7 | 10 | 1300 | |
| Example 13 | 1.7 | 80.0 | 6.4 | 3.6 | 1.8 | 10 | 1.7 | 10 | 1330 | |
| Example 14 | 1.7 | 80.0 | 6.7 | 3.3 | 2.0 | 10 | 1.7 | 10 | 1330 | |
| Example 15* | 1.7 | 80.0 | 7.1 | 2.9 | 2.4 | 10 | 1.7 | 10 | 1330 | |
| Example 16* | 1.7 | 85.0 | 2.9 | 2.1 | 1.4 | 5.0 | 1.7 | 10 | 1330 | |
| Example 17* | 1.7 | 78.0 | 7.0 | 5.0 | 1.4 | 12 | 1.7 | 10 | 1330 | |
| Example 18 | 1.7 | 82.5 | 4.4 | 3.1 | 1.4 | 7.5 | 1.7 | 10 | 1360 | |
| Example 19 | 1.7 | 82.5 | 4.4 | 3.1 | 1.4 | 7.5 | 1.7 | 10 | 1400 | |
| Example 20 | 1.7 | 81.5 | 4.2 | 4.3 | 1.0 | 8.5 | 1.7 | 10 | 1300 | Hydrogen atmosphere |
| Example 21 | 1.7 | 82.5 | 4.4 | 3.1 | 1.4 | 7.5 | 1.7 | 10 | 1360 | |
| Example 22 | 1.7 | 82.5 | 4.4 | 3.1 | 1.4 | 7.5 | 1.7 | 10 | 1400 | |

TABLE 1B

| | Bulk Density (g/cm³) | Water Absorption (%) | Porosity (%) | Pore Diameter (μm) | I1/(I1 + I2) | Relative Dielectric Constant | Dielectric Dissipation Factor × 10⁻⁴ | Strength (MPa) | Crystalline Phase |
|---|---|---|---|---|---|---|---|---|---|
| Example 1* | 3.37 | 3.0 | 8.1 | 2.1 | 0.00 | 8.2 | >30 | 300 | alumina |
| Example 2* | 3.59 | 0.0 | 5.5 | 2.0 | 0.00 | 8.6 | 16 | 500 | alumina |
| Example 3* | 3.53 | 0.0 | 5.0 | 3.7 | 0.00 | 8.5 | 16 | 380 | alumina |
| Example 4 | 3.49 | 0.0 | 2.1 | 4.8 | 0.29 | 8.3 | 5.0 | 400 | alumina, cordierite |
| Example 5 | 3.47 | 0.0 | 2.0 | 5.1 | 0.31 | 8.0 | 1.0 | 390 | alumina, cordierite |
| Example 6 | 3.38 | 0.0 | 1.9 | 5.3 | 0.40 | 7.6 | 1.0 | 310 | alumina, cordierite |
| Example 7 | 3.39 | 0.0 | 2.6 | 2.2 | 0.26 | 7.8 | 1.8 | 340 | alumina, cordierite, spinel |
| Example 8 | 3.53 | lity 2.2 | 2.2 | 2.0 | 0.29 | 8.2 | 2.0 | 490 | alumina, cordierite, spinel |
| Example 9 | 3.54 | 0.0 | 1.4 | 2.0 | 0.30 | 8.3 | 2.0 | 460 | alumina, cordierite, spinel |
| Example 10 | 3.56 | 0.0 | 1.4 | 2.3 | 0.27 | 8.4 | 1.7 | 450 | alumina, cordierite, spinel |
| Example 11* | 3.61 | 0.0 | 0.9 | 1.7 | 0.26 | 8.7 | 1.7 | 310 | alumina, cordierite, spinel |
| Example 12 | 3.58 | 0.0 | 1.2 | 2.0 | 0.28 | 8.5 | 1.5 | 380 | alumina, cordierite, spinel |
| Example 13 | 3.42 | 0.0 | 2.6 | 2.1 | 0.32 | 7.8 | 1.4 | 330 | alumina, cordierite, mullite |
| Example 14 | 3.35 | 0.2 | 4.5 | 2.2 | 0.33 | 7.3 | 3.2 | 300 | alumina, cordierite, mullite |
| Example 15* | 3.27 | 2.4 | 7.6 | 2.5 | 0.36 | 7.0 | 10 | 220 | alumina, cordierite, mullite |
| Example 16* | 3.30 | 2.5 | 7.7 | 2.5 | 0.22 | 7.0 | >30 | 220 | alumina, cordierite |
| Example 17* | 3.60 | 0.0 | 1.0 | 1.9 | 0.36 | 8.6 | 3.0 | 320 | alumina, cordierite, mullite |
| Example 18 | 3.56 | 0.0 | 1.4 | 2.1 | 0.26 | 8.3 | 1.9 | 430 | alumina, cordierite, mullite |
| Example 19 | 3.59 | 0.0 | 1.2 | 2.0 | 0.23 | 8.5 | 2.4 | 390 | alumina, cordierite, mullite |
| Example 20 | 3.53 | 0.0 | 2.2 | 2.0 | 0.29 | 8.1 | 2.0 | 490 | alumina, cordierite, spinel |
| Example 21 | 3.56 | 0.0 | 1.4 | 2.1 | 0.26 | 8.3 | 2.0 | 420 | alumina, cordierite, mullite |
| Example 22 | 3.59 | 0.0 | 1.2 | 2.0 | 0.23 | 8.5 | 2.5 | 380 | alumina, cordierite, mullite |

Production of Sintered Compact According to Examples

The methods of producing a sintered compact according to the examples described below are merely examples.

Commercially available powder was used as an alumina raw material. Alumina had a degree of purity of higher than or equal to 99.9% and a mean particle diameter of 1 to 3 μm. Commercially available $SiO_2$ powder was used as an Si component in the flux, and commercially available $MnCO_3$ powder was used as an Mn component. Both of the $SiO_2$ powder and the $MnCO_3$ powder had a degree of purity of higher than or equal to 99% and a mean particle diameter of 1 μm. In order to make a cordierite raw material, a mixture of the commercially available MgO powder, $SiO_2$ powder, and $Al_2O_3$ powder that had high degrees of purity and had a composition of cordierite was prepared. Each powder had a degree of purity of 99.9% and a mean particle diameter of less than or equal to 1 μm. The powder mixture was synthesized by heating at 1400° C. under atmospheric pressure and then pulverized into a cordierite raw material having a mean particle diameter adjusted in the range of 1 to 3 μm. Alternatively, commercially available cordierite powder may be used.

The alumina raw material, the flux raw material, and the cordierite raw material described above were weighed in accordance with each example in Table 1A and subjected to wet blending in a ball mill with an alumina ball and a polypot for three hours to obtain a slurry. The slurry was dried and sifted through a sieve to obtain blended powder.

The blended powder was molded at 100 kgf/cm² by dry pressing and further post-formed at 0.7 tonf/cm² by CIP into a disk-shaped compact having a diameter of approximately 65 mm and a thickness of approximately 12 mm. Note that the method for obtaining the compact may be any of other various methods.

The disk-shaped compact was placed in an alumina sheath and held at a firing temperature (i.e., maximum temperature) of 1300 to 1400° C. for two hours in air or hydrogen atmosphere in accordance with the conditions for each example, so as to obtain a sintered compact. The firing conducted in hydrogen atmosphere assumed a case of co-firing with the conductor such as buried wiring.

Evaluation Method for Sintered Compact

The bulk density and the water absorption were measured using the Archimedes method by cutting out a 3×4×40-mm flexural bar specified in JIS-R1601 from the sintered compact.

The relative dielectric constant and the dielectric dissipation factor were measured at 10 GHz using a double-end short-circuit resonance method in conformance with JIS-R1627 by cutting out a cylindrical member with a diameter of 14 to 15 mm and a thickness of 7.0 to 7.5 mm from the sintered compact.

The bending strength (simply expressed as "Strength" in Table 1B) was measured as a three-point bending strength in conformance with JIS-R1601 by cutting out a 3×4×40-mm flexural bar specified in JIS-R1601 from the sintered compact.

The porosity and the pore diameter were obtained by subjecting one side of a sample cut out from the sintered compact to mirror polishing and observing the sample with a scanning electron microscope (SEM). The porosity was obtained as an area ratio of closed pores in the material by binarizing the observed image. The pore diameter was obtained by calculating mean diameters of the major and minor axes of several tens of pores and obtaining an average of the mean diameters.

Figure 3:
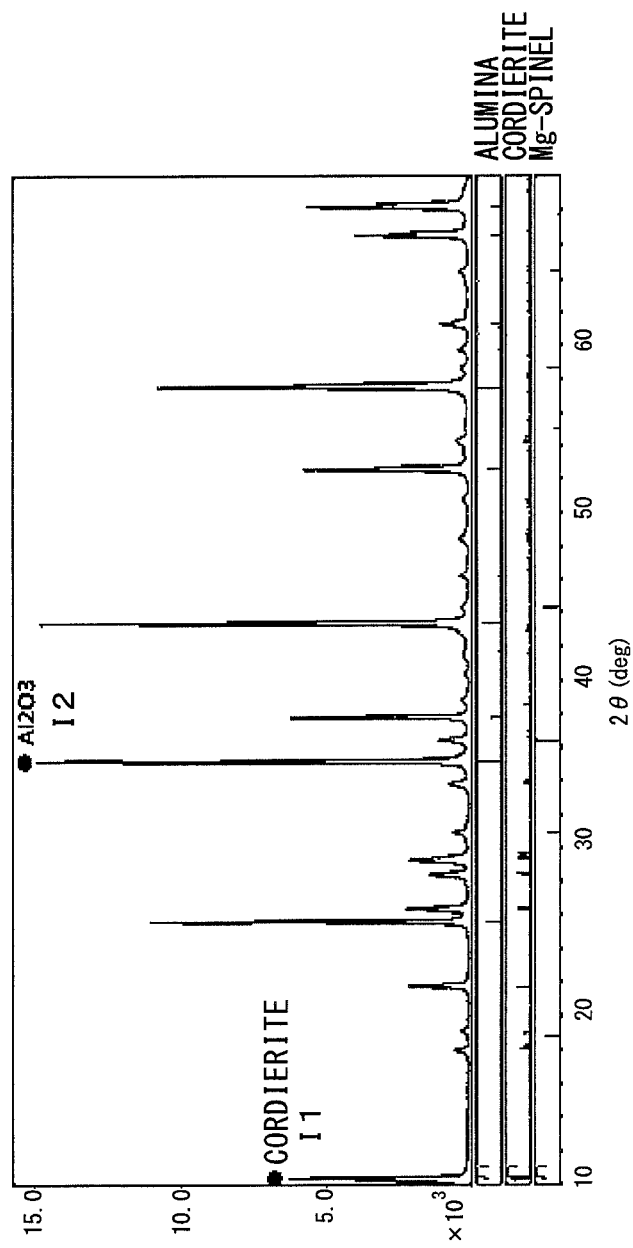
FIG. 3 illustrates an example of I1 and I2 according to Example 8.

Part of the sintered compact was pulverized in an alumina mortar, and its crystalline phases were identified by an XRD method using an X-ray diffraction instrument (XRD). Measurement conditions were as follows: CuKα, 40 kV, 40 mA, 2θ=5 to 70°, and a step size of 0.002°. From the measurement results, I1/(I1+I2) was calculated, where I1 was the strength of the main peak of cordierite and I2 was the strength of the main peak of alumina. FIG. 3 illustrates an example of I1 and I2 according to Example 8.

Explanation and Evaluation of Examples

Conditions and evaluation for each example in Tables 1A and 1B will be described. Examples with no asterisk after their number are examples according to the present invention, and examples with an asterisk are comparative examples for the present invention.

Examples 1 and 2 were comparative examples, in which the raw material did not contain cordierite. The raw material used was powder that contained alumina having a mean particle diameter of 2.9 μm with a content of 90.0 mass %, an Si component serving as a flux with a content of 5.8 mass % in terms of $SiO_2$, and an Mn component with a content of 4.2 mass % in terms of MnO ($SiO_2$/MnO=1.4). Since $MnCO_3$ was used in the raw material, mass % of MnO was obtained using the mass of $MnCO_3$ in terms of MnO. In Example 1, firing was conducted at 1330° C. for two hours in air atmosphere. In Example 2, firing was conducted at 1360° C. for two hours in air atmosphere.

The water absorption obtained by the firing at 1330° C. was 3.0%, i.e., a close-grained sintered compact was not obtained, and the dielectric dissipation factor was high. In the case of the firing at 1360° C., the water absorption was less than or equal to 1.0% and a close-grained sintered compact was obtained. However, the relative dielectric constant was 8.6 and the dielectric dissipation factor was $16 \times 10^{-4}$, which were both high. In this way, a low relative dielectric constant and a low dielectric dissipation factor could not be obtained when cordierite was not combined.

In Examples 3 to 6, cordierite was added with a content of 5.0 to 15 mass % to the raw material used in Examples 1 and 2, and firing was conducted under the conditions described in Table 1A in the same manner as in Examples 1 and 2. The amounts of cordierite were 5.0 mass % in Example 3, 8.7 mass % in Example 4, 10 mass % in Example 5, and 15 mass % in Example 6. In each example, the water absorption was 0.0%, and most of the pores in the sintered compact existed as closed pores.

Example 3 was a comparative example, in which the raw material for the sintered compact did not include a cordierite phase. The dielectric dissipation factor was $16 \times 10^{-4}$ and high. Examples 4 to 6 used materials that were made by changing the amount of cordierite and had almost the same porosities of 1.9 to 2.1%. I1/(I1+I2) was in the range of 0.29 to 0.40, and the sintered compacts included a cordierite phase. The relative dielectric constants were in the range of 7.6 to 8.3, and the dielectric dissipation factors were in the range of 1.0 to $5.0 \times 10^{-4}$. These relative dielectric constants and dielectric dissipation factors would decrease with increasing value of I1/(I1+I2). The bending strengths were higher than or equal to 300 MPa and satisfactory.

In Examples 7 to 10, firing was conducted under the conditions described in Table 1A in the same manner as in Example 1 to 6. In these examples, the mass ratios of the components of the flux ($SiO_2$/MnO) were fixed at 1.0, and the total volumes of the flux ($SiO_2$+MnO) were 6.5 mass % in Example 7, 8.5 mass % in Example 8, 10.0 mass % in Example 9, and 8.5 mass % in Example 10. The firing temperatures in Examples 7 to 9 were 1300° C., and the firing temperature in Example 10 was 1330° C.

In any of these examples, the water absorption, the relative dielectric constant, the dielectric dissipation factor, and the bending strength were satisfactory. In particular, in Examples 8 and 9, the bending strengths were respectively 490 MPa and 460 MPa and very high. In these two examples, the pore diameters were 2.0 μm, and pores were smaller than those with a pore diameter of 5.1 μm in Example 5. Thus, it can be thought that the sintered compacts had very high bending strengths. Example 10 showed satisfactory material characteristics including a relative dielectric constant of 8.4, a dielectric dissipation factor of $1.7 \times 10^{-4}$ and a bending strength of 450 MPa. However, when compared with Example 8, Example 10 showed decreases in porosity and I1/(I1+I2) and an increase in relative dielectric constant as a result of the firing at 1330° C. Besides, the bending strength also decreased. Thus, in the case of the composition of the raw material in Example 10, it is desirable that firing be conducted at 1300° C.

The phases described in the "Crystalline Phase" field in Table 1B, except alumina and cordierite, indicate phases detected in trace amounts by an X-ray diffraction method.

The coefficient of thermal expansion of the sintered compact in Example 8 was measured at temperatures ranging from 40 to 1000° C. by a method specified in JIS-R1618. The coefficient of thermal expansion in Example 8 was 7.0 ppm/° C. and lower than 8.2 ppm/° C., which was the coefficient of thermal expansion of alumina alone. This indicates that combining the cordierite phase lowered the coefficient of thermal expansion. As a result, a difference in the coefficient of thermal expansion from the conductor such as Cu—W decreased relatively, which made it possible to suppress the occurrence of problems such as cracks or warpage at the time of burying the conductor.

In Examples 11 to 15, firing was conducted under the conditions described in Table 1A in the same manner as in Examples 1 to 10. In these examples, the total volumes of the flux ($SiO_2$+MnO) were fixed at 10.0 mass %. The mass ratios of the components of the flux ($SiO_2$/MnO) were 0.5 in Example 11, 0.6 in Example 12, 1.8 in Example 13, 2.0 in Example 14, and 2.4 in Example 15.

Example 11 increased the Mn component in the flux, and Example 15 increased the Si component in the flux, both examples being comparative examples. In Example 11, Mn and cordierite could react more easily with each other, so that the porosity and I1/(I1+I2) decreased and the relative dielectric constant was 8.7 and high. In Example 15, the reaction was hard to proceed because of a large volume of the Si component. As a result, the water absorption and the porosity increased, and the dielectric dissipation factor was $10 \times 10^{-4}$ and high. In Examples 12 to 14, the flux was adjusted to have a mass ratio of 0.6 to 2.0, in comparison with the flux in Examples 11 and 15. Examples 12 to 14 could obtain satisfactory characteristics including relative dielectric constants of less than or equal to 8.5, dielectric dissipation factors of less than or equal to $5.0 \times 10^{-4}$, and bending strengths of higher than or equal to 300 MPa. It can be said from the results of Examples 11 to 15 that the mass ratio of the flux be preferably adjusted in the range of 0.6 to 2.0 and more preferably in the range of 1.0 to 1.4 in order to obtain satisfactory characteristics including a relative dielectric constant of less than or equal to 8.5, a dielectric dissipation factor of less than or equal to $5.0 \times 10^{-4}$, and a bending strength of higher than or equal to 300 MPa.

In Examples 16 and 17, firing was conducted under the conditions described in Table 1A in the same manner as in Examples 1 to 15. The mass of the flux in Example 16 was adjusted to 5.0 mass %, and the mass of the flux in Example 17 was adjusted to 12 mass %. Examples 16 and 17 were both comparative examples. In Example 16, the dielectric dissipation factor was higher than or equal to $30 \times 10^{-4}$ due to insufficient sintering and that was high. In Example 17, it can be thought that the relative dielectric constant was 8.6 and high due to a decrease in porosity. Examples 16 and 17 and other examples indicate that the mass of the flux be desirably adjusted in the range of 6 to 11 mass % and preferably in the range of approximately 7.5 to 10 mass % in order to obtain satisfactory characteristics including a relative dielectric constant of less than or equal to 8.5, a dielectric dissipation factor of less than or equal to $5.0 \times 10^{-4}$, and a bending strength of higher than or equal to 300 MPa.

In Examples 18 and 19, firing was conducted under the conditions described in Table 1A in the same manner as in Examples 1 to 17. The firing temperature in Example 18 was 1360° C., and the firing temperature in Example 19 was 1400° C. It can be seen from Examples 18 and 19 that, even if the firing temperature is increased, satisfactory characteristics including a relative dielectric constant of less than or equal to 8.5, a dielectric dissipation factor of less than or equal to $5.0 \times 10^{-4}$, and a strength of higher than or equal to 300 MPa can be obtained by adjusting the mass ratio or total volume of the flux.

In Examples 20 to 22, firing was conducted under the conditions described in Table 1A in the same manner as in Examples 1 to 19. In Examples 20 to 22, firing was conducted in a reducing environment in which hydrogen was introduced. It can be seen from Examples 20 to 22 that material characteristics equivalent to those obtained by firing in air environment can be obtained even in a reducing environment. Accordingly, it is possible to conduct co-firing with the conductor in reducing atmosphere.

The results of the above examples show that a sintered compact that includes an alumina phase as a primary phase and further includes a flux phase and a cordierite phase can obtain a low relative dielectric constant, a low dielectric dissipation factor, and a desired bending strength by setting its porosity to be higher than or equal to 1.2% (Examples 12, 19, and 22) and less than or equal to 4.5% (Example 14). When the porosity of 1.0% in Example 17 and the porosity of 7.6% in Example 15, both examples being comparative examples, are taken into consideration, it can be thought that a low dielectric constant, a low dielectric dissipation factor, and a desired bending strength can be obtained when the porosity is higher than or equal to 1.1% and less than or equal to 5.0%.

If such a porosity can be obtained, the ratio of the cordierite phase may be appropriately determined as long as the alumina phase serves as the primary phase. However, it is considered preferable from the results of the examples that I1/(I1+I2) is greater than or equal to 0.20 and less than or equal to 0.45, where I1 is the strength of the main peak of cordierite obtained by an XRD method and I2 is the strength of the main peak of alumina. More preferably, I1/(I1+I2) is greater than or equal to 0.23 and less than or equal to 0.40 in consideration of the ranges of I1/(I1+I2) in the examples other than the comparative examples.

In the above examples, as a condition for low relative dielectric constants, the relative dielectric constant was assumed to be less than or equal to 8.5 at 10 GHz. As a condition for low dielectric dissipation factors, the dielectric dissipation factor was assumed to be less than or equal to $5 \times 10^{-4}$ at 10 GHz. These conditions considered cases where the sintered compacts were to be used as materials for high-frequency circuit components. The results of the examples show that it is possible enough to provide a sintered compact having a relative dielectric constant of less than or equal to 8.3 at 10 GHz and a dielectric dissipation factor of less than or equal to $2 \times 10^{-4}$ at 10 GHz.

Since the strength of the sintered compact as a whole depends on the dimensions of the sintered compact, the conditions for bending strength can be set somewhat leniently. Preferably, the bending strength of the material for circuit components is higher than or equal to 300 MPa. In the case where the water absorption is high, the dielectric dissipation factor increases along with a decrease in bending strength, and therefore the water absorption is preferably as low as possible. The water absorption is most preferably 0.0%, but may be less than or equal to 1.0%.

The results of the examples indicate that the relative dielectric constant tends to become higher under the condition of lower pore diameters, i.e., mean pore diameters, so that the pore diameter is preferably greater than or equal to 2.0 μm. Although there is no fixed upper limit for the pore diameter, too large pore diameters are not preferable from the viewpoint of the bending strength. Thus, the pore diameter is preferably less than or equal to 5.5 μm.

From the results of the examples, it is considered preferable that the raw powder contains alumina with a content higher than or equal to 70 mass % and lower than or equal to 85 mass %, an Si component with a content higher than or equal to 3 mass % and lower than or equal to 7 mass % in terms of $SiO_2$, an Mn component with a content higher than or equal to 3 mass % and lower than or equal to 6.5 mass % in terms of MnO, and cordierite with a content higher than or equal to 8 mass % and lower than or equal to 15 mass %. When the allowable ratios of the other additives are taken into consideration, a total of the contents of these four components in the raw powder is higher than or equal to 85 mass % and more preferably higher than or equal to 95%. An example of the other additives is an additive that adjusts the color of the sintered compact.

While depending also on the characteristics required for the sintered compact, the raw powder more preferably contains alumina with a content higher than or equal to 80 mass % and lower than or equal to 83 mass %. More preferably, the raw powder contains the Si component with a content higher than or equal to 4.2 mass % and lower than or equal to 5.8 mass % in terms of $SiO_2$. More preferably, the raw powder contains the Mn component with a content higher than or equal to 3.1 mass % and lower than or equal to 5.0 mass % in terms of MnO. More preferably, the raw powder contains cordierite with a content higher than or equal to 9 mass % and lower than or equal to 12 mass %.

As described previously, the amount of the flux in the raw powder and the ratio of each component of the flux also affect the characteristics of the sintered compact. From the examples, it is preferable that the sum of the mass of the Si component in terms of $SiO_2$ and the mass of the Mn component in terms of MnO in the raw powder is greater than or equal to 6 mass % of the raw powder and less than or equal to 11 mass % of the raw powder. More preferably, the sum is greater than or equal to 7.5 mass % and less than or equal to 10 mass %.

In the raw powder, the ratio of the mass of the Si component in terms of $SiO_2$ and the mass of the Mn component in terms of MnO is preferably higher than or equal to 0.6 and lower than or equal to 2.0. More preferably, the ratio is higher than or equal to 1.0 and lower than or equal to 1.4.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

INDUSTRIAL AVAILABILITY

The sintered compact according to the present invention can be used as various components that are required to have lower relative dielectric constants and lower dielectric dissipation factors. In particular, the sintered compact is suitable for the material for circuit components that are required to have higher frequencies.

REFERENCE SIGNS LIST

1 Circuit component
10 Sintered compact
12 Conductor
S1 to S4 Step

The invention claimed is:

1. A sintered compact including an alumina phase as a primary phase, and further including an amorphous phase containing Si and Mn and a cordierite phase,
the sintered compact having a porosity of higher than or equal to 1.1% and less than or equal to 5.0%.

2. The sintered compact according to claim 1, wherein I1/(I1+I2) is greater than or equal to 0.20 and less than or equal to 0.45, where I1 is a strength of a main peak of cordierite obtained by an XRD method, and I2 is a strength of a main peak of alumina.

3. The sintered compact according to claim 2, wherein I1/(I1+I2) is greater than or equal to 0.23 and less than or equal to 0.40.

4. The sintered compact according to claim 1, having a relative dielectric constant of less than or equal to 8.5 at 10 GHz.

5. The sintered compact according to claim 1, having a dielectric dissipation factor of less than or equal to $5 \times 10^{-4}$ at 10 GHz.

6. The sintered compact according to claim 1, having a bending strength of higher than or equal to 300 MPa.

7. The sintered compact according to claim 1, having a water absorption of less than or equal to 1.0%.

8. The sintered compact according to claim 1, having a mean pore diameter of greater than or equal to 2.0 μm and less than or equal to 5.5 μm.

9. A circuit component comprising:
the sintered compact according to claim 1; and
a conductor disposed on a surface of said sintered compact or inside said sintered compact.

10. A method of producing the sintered compact according to claim 1, comprising:
a) preparing powder that contains alumina with a content higher than or equal to 70 mass % and lower than or equal to 85 mass %, an Si component with a content higher than or equal to 3 mass % and lower than or equal to 7 mass % in terms of $SiO_2$, an Mn component with a content higher than or equal to 3 mass % and lower than or equal to 6.5 mass % in terms of MnO, and cordierite with a content higher than or equal to 8 mass % and lower than or equal to 15 mass %, a total of the contents of these four components being higher than or equal to 85 mass %;
b) obtaining a compact of said powder; and
c) firing said compact.

11. The method of producing a sintered compact according to claim 10, wherein
in said operation c), a firing temperature is kept in a range of 1200° C. to 1400° C. for a duration of more than or equal to one hour and less than or equal to three hours.

12. The method of producing a sintered compact according to claim 10, wherein
in said operation a), a sum of the mass of the Si component in terms of $SiO_2$ and the mass of the Mn component in terms of MnO is less than or equal to 11 mass % of said powder.

13. The method of producing a sintered compact according to claim 10, wherein
in said operation a), a ratio between the mass of the Si component in terms of $SiO_2$ and the mass of the Mn component in terms of MnO is higher than or equal to 0.6 and lower than or equal to 2.0.

* * * * *